(12) United States Patent
Kato

(10) Patent No.: US 9,478,575 B2
(45) Date of Patent: Oct. 25, 2016

(54) SOLID-STATE IMAGE SENSOR

(75) Inventor: Taro Kato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 14/233,329

(22) PCT Filed: Aug. 21, 2012

(86) PCT No.: PCT/JP2012/071521
§ 371 (c)(1),
(2), (4) Date: Jan. 16, 2014

(87) PCT Pub. No.: WO2013/031707
PCT Pub. Date: Mar. 7, 2013

(65) Prior Publication Data
US 2014/0145287 A1 May 29, 2014

(30) Foreign Application Priority Data

Sep. 1, 2011 (JP) ................................. 2011-191072

(51) Int. Cl.
*H01L 27/146* (2006.01)
(52) U.S. Cl.
CPC ... *H01L 27/14625* (2013.01); *H01L 27/14621* (2013.01); *H01L 27/14629* (2013.01)
(58) Field of Classification Search
CPC .............................................. H01L 27/14629
See application file for complete search history.

(56) References Cited

U.S. PATENT DOCUMENTS

| 7,755,123 B2 | 7/2010 | Dungan et al. ............... 257/294 |
| 8,154,062 B2 | 4/2012 | Park |
| 8,471,300 B2 | 6/2013 | Park |
| 8,670,051 B2 | 3/2014 | Kato |
| 8,735,953 B2 | 5/2014 | Gidon et al. |
| 2009/0008683 A1* | 1/2009 | Nishizawa ..................... 257/292 |
| 2009/0050947 A1* | 2/2009 | Dungan ............ H01L 27/14625 257/294 |

(Continued)

FOREIGN PATENT DOCUMENTS

| CN | 101133495 A | 2/2008 |
| CN | 101667584 A | 3/2010 |

(Continued)

OTHER PUBLICATIONS

Nov. 4, 2015 Chinese Office Action corresponding to Chinese Patent Application No. 201280041321.5.

Primary Examiner — Dale Page
Assistant Examiner — Christopher Johnson
(74) Attorney, Agent, or Firm — Fitzpatrick, Cella, Harper & Scinto

(57) ABSTRACT

An image sensor includes a first pixel having a first color filter, a first reflection region which reflects light from the first color filter, and a first photoelectric conversion portion arranged in a semiconductor layer and located between the first color filter and the first reflection region, and a second pixel including a second color filter, a second reflection region which reflects light from the second color filter, and a second photoelectric conversion portion arranged in the semiconductor layer and located between the second color filter and the second reflection region. Wavelength corresponding to a maximum transmittance of the first color filter is shorter than wavelength corresponding to a maximum transmittance of the second color filter. An area of the first reflection region is smaller than area of the second reflection region.

15 Claims, 8 Drawing Sheets

(56) References Cited

U.S. PATENT DOCUMENTS

| | | |
|---|---|---|
| 2010/0059803 A1 | 3/2010 | Gidon et al. |
| 2010/0148290 A1* | 6/2010 | Park .............................. 257/432 |
| 2011/0045869 A1 | 2/2011 | Nishizawa |
| 2012/0175720 A1 | 7/2012 | Park |
| 2013/0280850 A1 | 10/2013 | Park |
| 2014/0035086 A1 | 2/2014 | Kato |
| 2014/0117481 A1 | 5/2014 | Kato et al. |
| 2014/0197509 A1* | 7/2014 | Haddad et al. ............... 257/432 |

FOREIGN PATENT DOCUMENTS

| | | |
|---|---|---|
| JP | 2003-152217 A | 5/2003 |
| JP | 2006-261372 A | 9/2006 |
| JP | 2007-027604 A | 2/2007 |
| JP | 2010-062567 A | 3/2010 |
| JP | 2010-147474 A | 7/2010 |
| JP | 2011-114150 A | 6/2011 |

\* cited by examiner

SOLID-STATE IMAGE SENSOR

TECHNICAL FIELD

The present invention relates to a solid-state image sensor.

BACKGROUND ART

U.S. Pat. No. 7,755,123 describes a backside illuminated imaging device in which the thickness of a substrate is reduced to allow a photosensor to easily detect light incident on a back surface. FIG. 7 appended to this specification depicts a backside illuminated imaging device described in FIG. 1C of U.S. Pat. No. 7,755,123. The imaging device described in U.S. Pat. No. 7,755,123 includes a radiation reflector 128 that reflects photons, which are incident on and transmitted through a back surface of a semiconductor device substrate 104 or 104d1 to 104d3, toward a photosensor formed in the semiconductor device substrate.

When radiation reflectors are respectively included in red, green, and blue pixels, for example, some light rays, which are obliquely incident on a color filter of the green pixel and are transmitted through the color filter, may be reflected by the radiation reflector of the blue pixel, and may be incident on the photosensor of the blue pixel. In this case, mixture of colors may occur between the green and blue pixels. Likewise, mixture of colors may occur between the green and blue pixels.

SUMMARY OF INVENTION

The present invention provides a technique advantageous to improve image quality.

One of the aspects of the present invention provides a solid-state image sensor including a semiconductor layer, the sensor comprising: a pixel of a first type including a first color filter, a first reflection region which reflects light transmitted through the first color filter, and a first photoelectric conversion portion arranged in the semiconductor layer, the first photoelectric conversion portion being located between the first color filter and the first reflection region; and a pixel of a second type including a second color filter, a second reflection region which reflects light transmitted through the second color filter, and a second photoelectric conversion portion arranged in the semiconductor layer, the second photoelectric conversion portion being located between the second color filter and the second reflection region, wherein a wavelength corresponding to a maximum transmittance of the first color filter is shorter than a wavelength corresponding to a maximum transmittance of the second color filter, and an area of the first reflection region is smaller than an area of the second reflection region.

Further features of the present invention will become apparent from the following description of exemplary embodiments with reference to the attached drawings.

DESCRIPTION OF EMBODIMENTS

Figure 1:
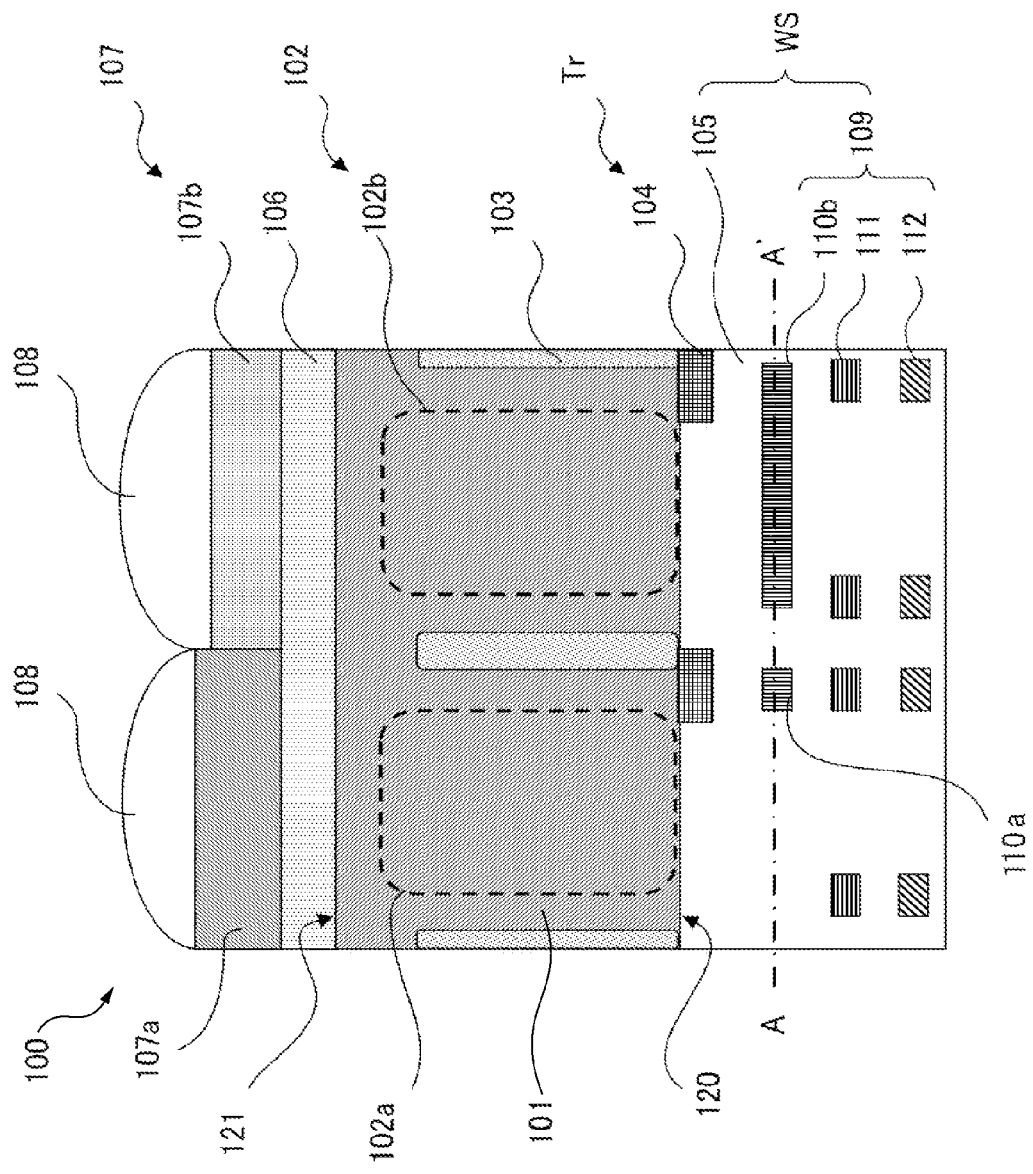
FIG. 1 is a view illustrating the arrangement of a solid-state image sensor according to the first embodiment.
Figure 2:
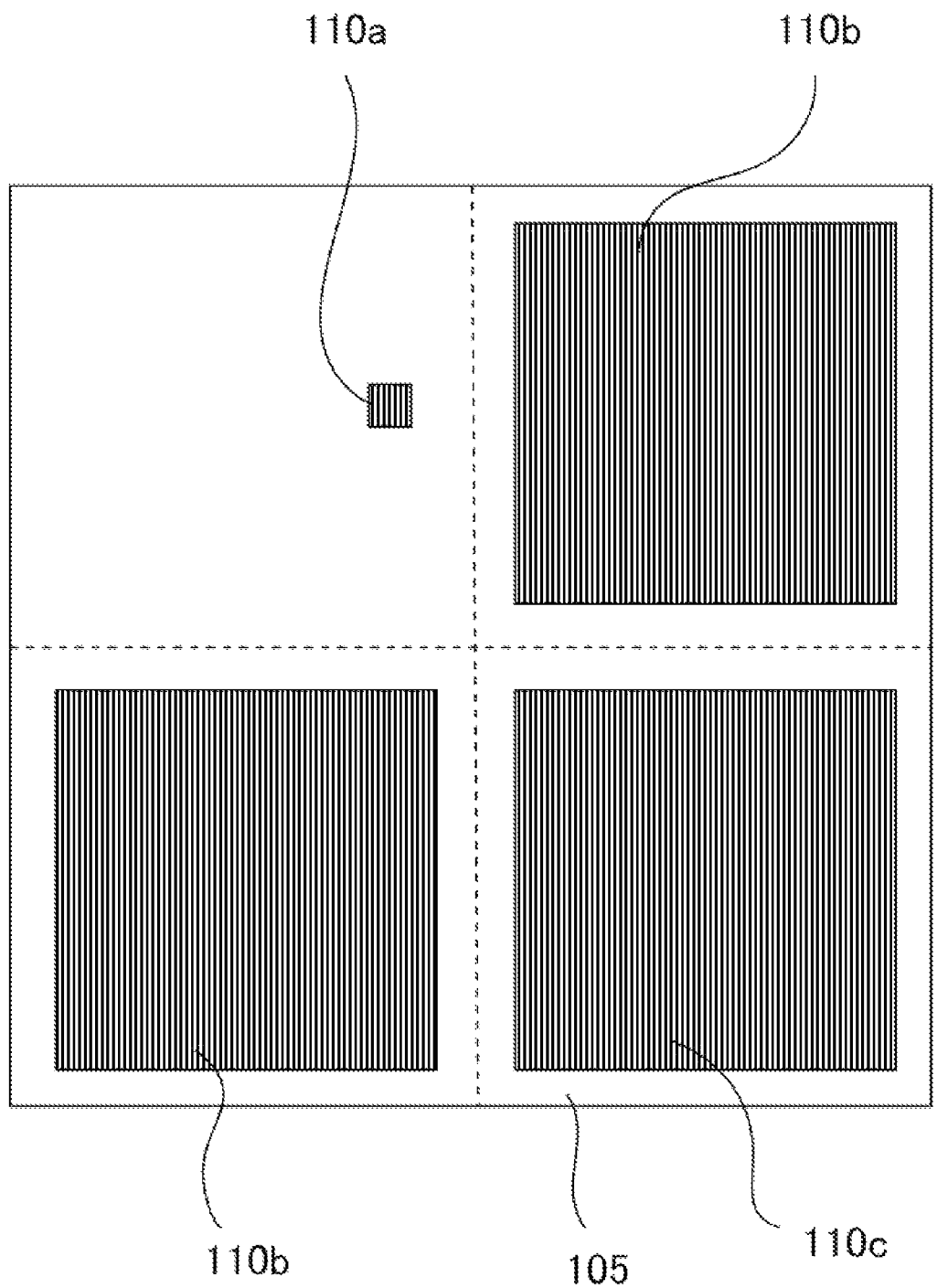
FIG. 2 is a view illustrating the arrangement of the solid-state image sensor according to the first embodiment.
Figure 3:
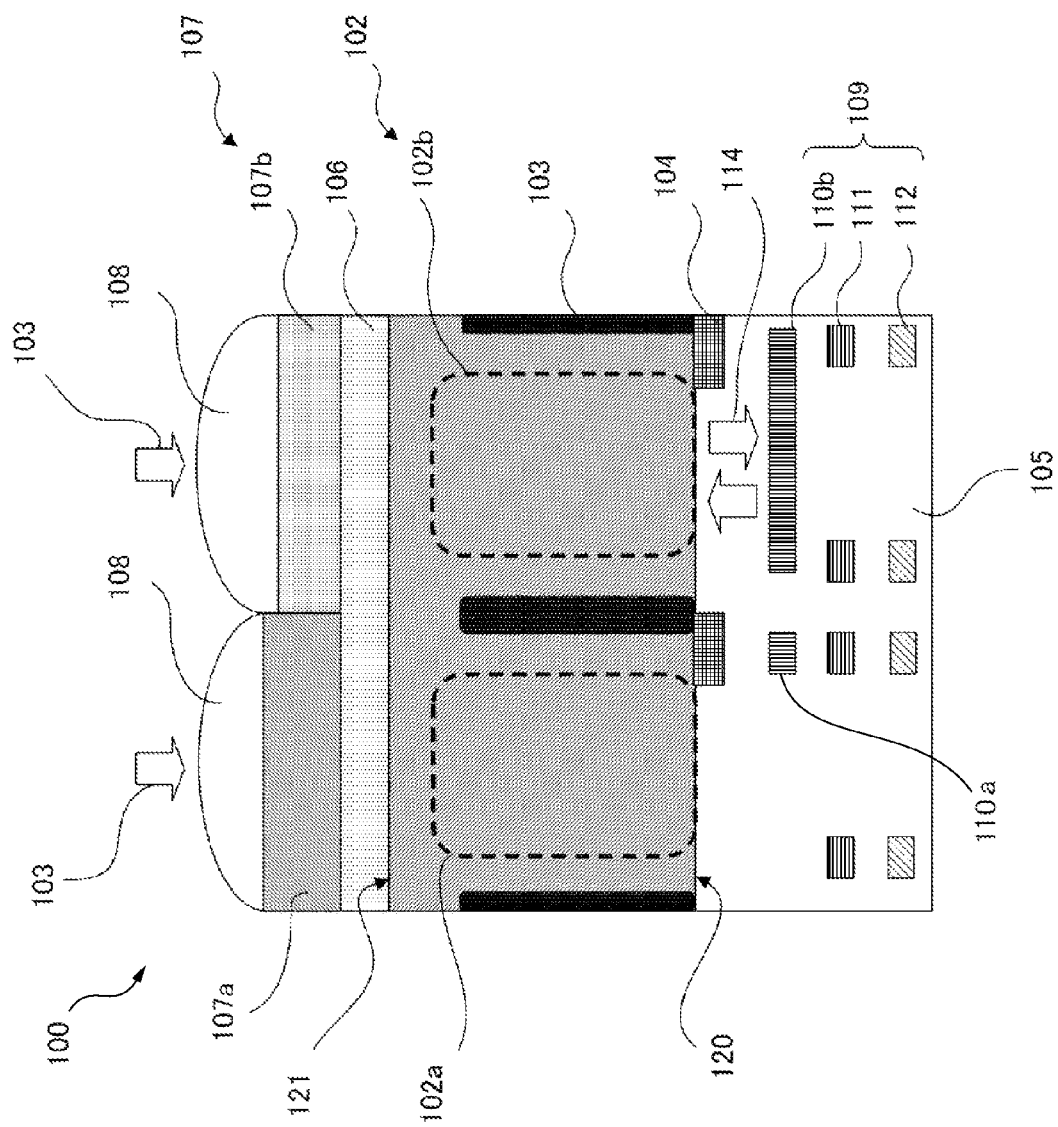
FIG. 3 is a view illustrating the functions of the solid-state image sensor according to the first embodiment.
Figure 4:
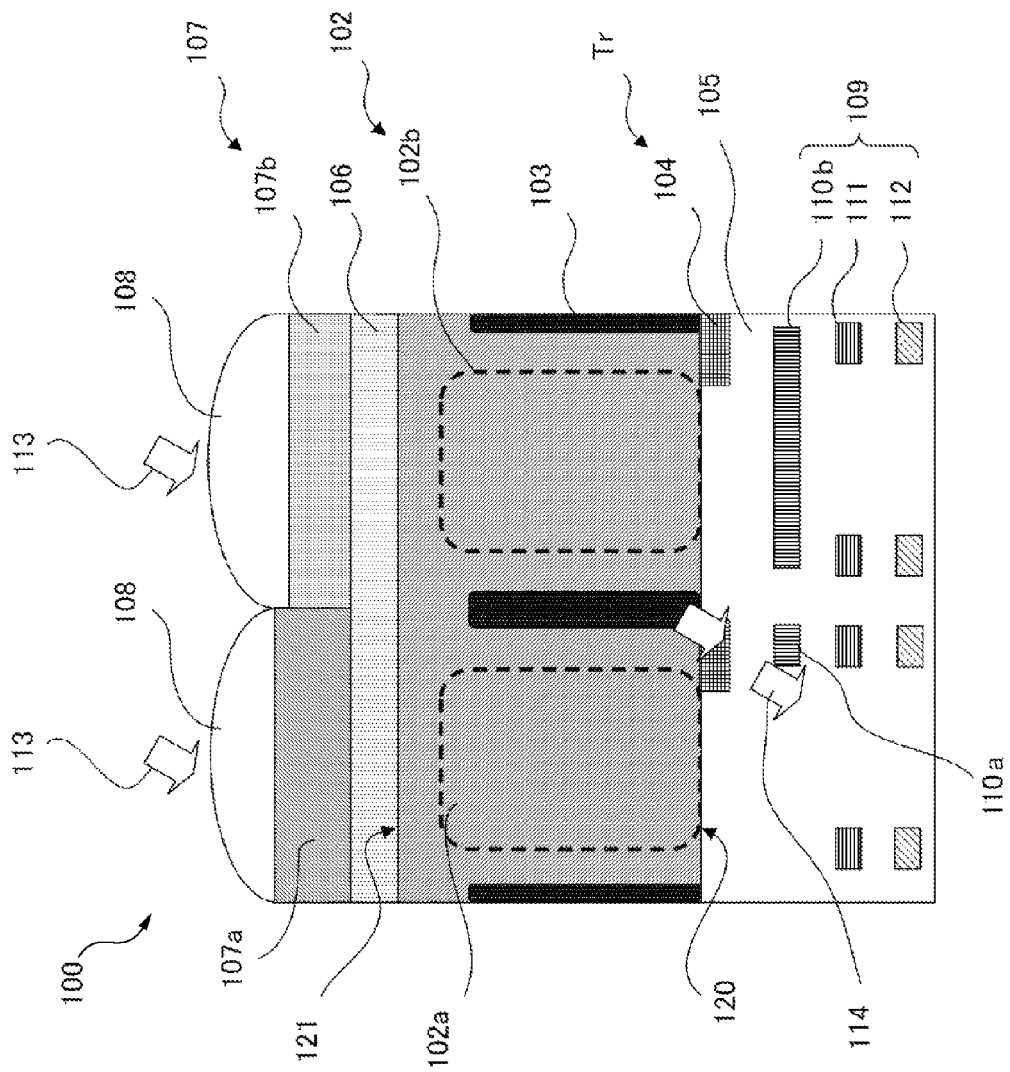
FIG. 4 is a view illustrating the functions of the solid-state image sensor according to the first embodiment.

A solid-state image sensor 100 according to the first embodiment of the present invention will be described below with reference to FIGS. 1 to 4 and FIGS. 5A and 5B. FIGS. 1, 3, and 4 are sectional views of the solid-state image sensor 100 taken along a plane perpendicular to its image sensing surface, and illustrate only two pixels for the sake of simplicity. Note that the image sensing surface is a surface on which a pixel array formed by arraying a plurality of pixels is arranged. FIG. 2 is a sectional view of the solid-state image sensor 100 taken along an A-A' plane in FIG. 1 as a plane parallel to its image sensing surface. The solid-state image sensor 100 can be configured as, for example, a MOS image sensor or CCD image sensor.

The solid-state image sensor 100 includes a semiconductor layer 101 having a first face 120 and second face 121. The semiconductor layer 101 can be configured by, for example, a silicon substrate. The solid-state image sensor 100 further includes a wiring structure WS which is arranged on the side of the first face 120 of the semiconductor layer 101, and a color filter layer 107 arranged on the side of the second face 121 of the semiconductor layer 101. The color filter layer 107 can include a first color filter 107a, second color filter 107b, and third color filter 107c (not shown). The arrangement of the first, second, and third color filters 107a, 107b, and 107c can follow, for example, a Bayer matrix. A wavelength corresponding to a maximum transmittance of the first color filter 107a is shorter than that corresponding to a maximum transmittance of the second color filter 107b. The wavelength corresponding to the maximum transmittance of the first color filter 107a is shorter than that corresponding to a maximum transmittance of the third color filter 107c. Typically, the maximum value of a transmittance of a color filter can be decided within a visible light wavelength range of 380 to 810 nm.

The following description will be given under the assumption that the first color filter 107a transmits light of a blue (B) wavelength range, the second color filter 107b transmits light in a green (G) wavelength range, and the third color filter 107c transmits light in a red (R) wavelength range. However, the present invention can also be achieved in an arrangement in which the first color filter 107a transmits light of a blue (B) wavelength range, the second color filter 107b transmits light in a red (R) wavelength range, and the third color filter 107c transmits light in a green (G) wavelength range.

The solid-state image sensor 100 can further include a plurality of microlenses 108 arrayed on the color filter layer 107. The solid-state image sensor 100 can further have a planarization layer 106 between the second face 121 of the semiconductor layer 101 and the color filter layer 107. The planarization layer 106 can serve as, for example, an underlying film of the color filter layer 107. At an image sensing timing, light is incident on photoelectric conversion portions 102 via the microlenses 108. In this case, each microlens 108 is arranged on the side of the second face 121 of the semiconductor layer 101, and the wiring structure WS is arranged on the side of the first face 120 of the semiconductor layer 101. In this manner, the solid-state image sensor which receives light from the side of the second face opposite to the side of the first face on which wiring structure is arranged can be called a backside illuminated solid-state image sensor.

A plurality of photoelectric conversion portions 102 are formed in the semiconductor layer 101. The semiconductor layer 101 and each photoelectric conversion portion 102 are formed of impurity semiconductor regions of opposing conductivity types, and they form a p-n junction (photodiode). The photoelectric conversion portion 102 is a region where carriers having the same polarity as that of charges to be read out as a signal are majority carriers. In the semiconductor layer 101, an element isolation portion 103 which isolates the neighboring photoelectric conversion portions 102 from each other can be formed. The element isolation portion 103 can include an impurity semiconductor region having a conductivity type opposite to that of the photoelectric conversion portion 102 and/or an insulator. In this case, the insulator can be LOCOS isolation, STI isolation, or the like.

The solid-state image sensor 100 further includes a plurality of transistors Tr formed on the first face 120 of the semiconductor layer 101 so as to read out signals of the photoelectric conversion portions 102 or 102a, 102b and 102c. Each transistor Tr includes a gate electrode 104 made up of, for example, polysilicon. In FIGS. 1, 3, and 4, a source, drain, gate oxide film, and the like which form the transistor Tr are not shown. When the solid-state image sensor 100 is configured as a MOS image sensor, the plurality of transistors Tr can include, for example, transfer transistors required to transfer charges accumulated on the photoelectric conversion portions 102 to floating diffusions (not shown).

The wiring structure WS includes a stacked wiring portion 109 and interlayer insulation film 105. The stacked wiring portion 109 can include, for example, a first wiring layer 110, second wiring layer 111, and third wiring layer 112. The interlayer insulation film 105 can be formed of, for example, a silicon oxide film. In this embodiment, the first wiring layer 110 forms a reflection region that reflects light rays which are transmitted through the color filters 107a, 107b, and 107c, are incident on the photoelectric conversion portions 102, and are transmitted through the photoelectric conversion portions 102. The first wiring layer 110 can include a first reflection region 110a, second reflection region 110b, and third reflection region 110c, as exemplified in FIG. 2.

The first wiring layer 110, second wiring layer 111, and third wiring layer 112 as the stacked wiring portion 109 can contain, for example, one of aluminum, copper, gold, tungsten, titanium, and tantalum as a major component. Alternatively, the first reflection region 110a, second reflection region 110b, and third reflection region 110c can be formed by a member containing, for example, one of aluminum, copper, gold, tungsten, titanium, and tantalum as a major component.

The solid-state image sensor 100 includes a pixel array configured by arraying a plurality of pixels. The plurality of pixels include at least pixels of a first type and those of a second type, and typically include pixels of a first type, those of a second type, and those of a third type. In one example, the pixel of the first type can include the first color filter 107a, first photoelectric conversion portion 102a, and first reflection region 110a. The first reflection region 110a reflects light rays, which are transmitted through the first color filter 107a, are incident on the first photoelectric conversion portion 102a, and are transmitted through the first photoelectric conversion portion 102a, toward the first photoelectric conversion portion 102a. The pixel of the second type can include the second color filter 107b, second photoelectric conversion portion 102b, and second reflection region 110b. The second reflection region 110b reflects light rays, which are transmitted through the second color filter 107b, are incident on the second photoelectric conversion portion 102b, and are transmitted through the second photoelectric conversion portion 102b, toward the second photoelectric conversion portion 102b. The pixel of the third type can include the third color filter 107c, third photoelectric conversion portion 102c, and third reflection region 110c. The third reflection region 110c reflects light rays, which are transmitted through the third color filter 107c, are incident on the third photoelectric conversion portion 102c, and are transmitted through the third photoelectric conversion portion 102c, toward the third photoelectric conversion portion 102c. The area of the first reflection region 110a is smaller than that of the second reflection region 110b. Also, the area of the first reflection region 110a is smaller than that of the third reflection region 110c.

Absorption of light by the semiconductor layer 101 and effects obtained when the reflection regions 110a, 110b, and 110c are arranged will be described below under the assumption that the thickness of the semiconductor layer 101 is 3 µm, so as to provide a practical example. A ratio of absorption of light, which is incident on the second face 121, by the semiconductor region between the second face 121 and first face 120 (a ratio to light incident on the second face 121) is different depending on wavelengths of light. A case will be examined below wherein light is perpendicularly incident on the second face 121. In this case, until light passed through the second face 121 reaches the first face 120, about 87.2% of light rays of a wavelength of 550 nm, which are transmitted through the green color filter 107b, is absorbed, and about 70.3% of light rays of a wavelength of 620 nm, which are transmitted through the red color filter 107c, is absorbed. At this time, as illustrated in FIG. 3, light rays 114, which are not absorbed, are reflected by the first wiring layer 110 including the reflection regions 110a, 110b, and 110c, are returned to the photoelectric conversion portions 102, and are absorbed by the photoelectric conversion portions 102. Hence, by arranging the reflection regions 110a, 110b, and 110c, the sensitivity can be improved.

On the other hand, 99.9% of light rays 113 of a wavelength of 450 nm, which are transmitted through the blue color filter 107a, is absorbed after they travel from the second face 121 before they reach the first face 120. That is, most of the light rays 113 of the wavelength of 450 nm are photoelectrically converted by the photoelectric conversion portion 102 before they reach the first face 120. For this reason, the reflection region 110a arranged on the side of the first face 120 of the blue pixel (pixel of the first type) has nearly no influence on the sensitivity if its area is smaller than those of the reflection regions 110b and 110c which are arranged on the side of the first face 120 of the green and red pixels. Rather, the light rays 114 of green and red regions, which are transmitted through the photoelectric conversion portions 102 of surrounding pixels, can be incident on the first reflection region 110a included in the blue pixel (pixel of the first type), as illustrated in FIG. 4. Such light rays 114 can be reflected by the first reflection region 110a included in the blue pixel (pixel of the first type), and can be incident on the first photoelectric conversion portion 102a of the blue pixel. Thus, mixture of colors occurs since signals of pixels of other colors are mixed in a signal of the blue pixel.

Therefore, since the area of the first reflection region 110a of the blue pixel (pixel of the first type) is set to be smaller than those of the second and third reflection regions 110b and 110c, improvement of the sensitivity and reduction of mixture of colors can be realized. In this case, by only setting the area of the first reflection region 110a of the blue pixel (pixel of the first type) to be smaller than that of one of the second and third reflection regions 110b and 110c, the effects of improvement of the sensitivity and reduction of mixture of colors can be obtained.

In the first embodiment, since the reflection regions 110a, 110b, and 110c are formed by the wiring layer 110, another layer need not be added, thus suppressing the manufacturing processes from being complicated. In the first embodiment, the reflection regions 110a, 110b, and 110c are formed by the wiring layer closest to the first face 120 of the semiconductor layer 101 of the plurality of wiring layers 110, 111, and 112. Thus, the distances between the reflection regions 110a, 110b, and 110c and photoelectric conversion portions 102 can be shortened, and stray light can be reduced. As a result, the sensitivity can be improved, and mixture of colors can be reduced.

Figure 5A:
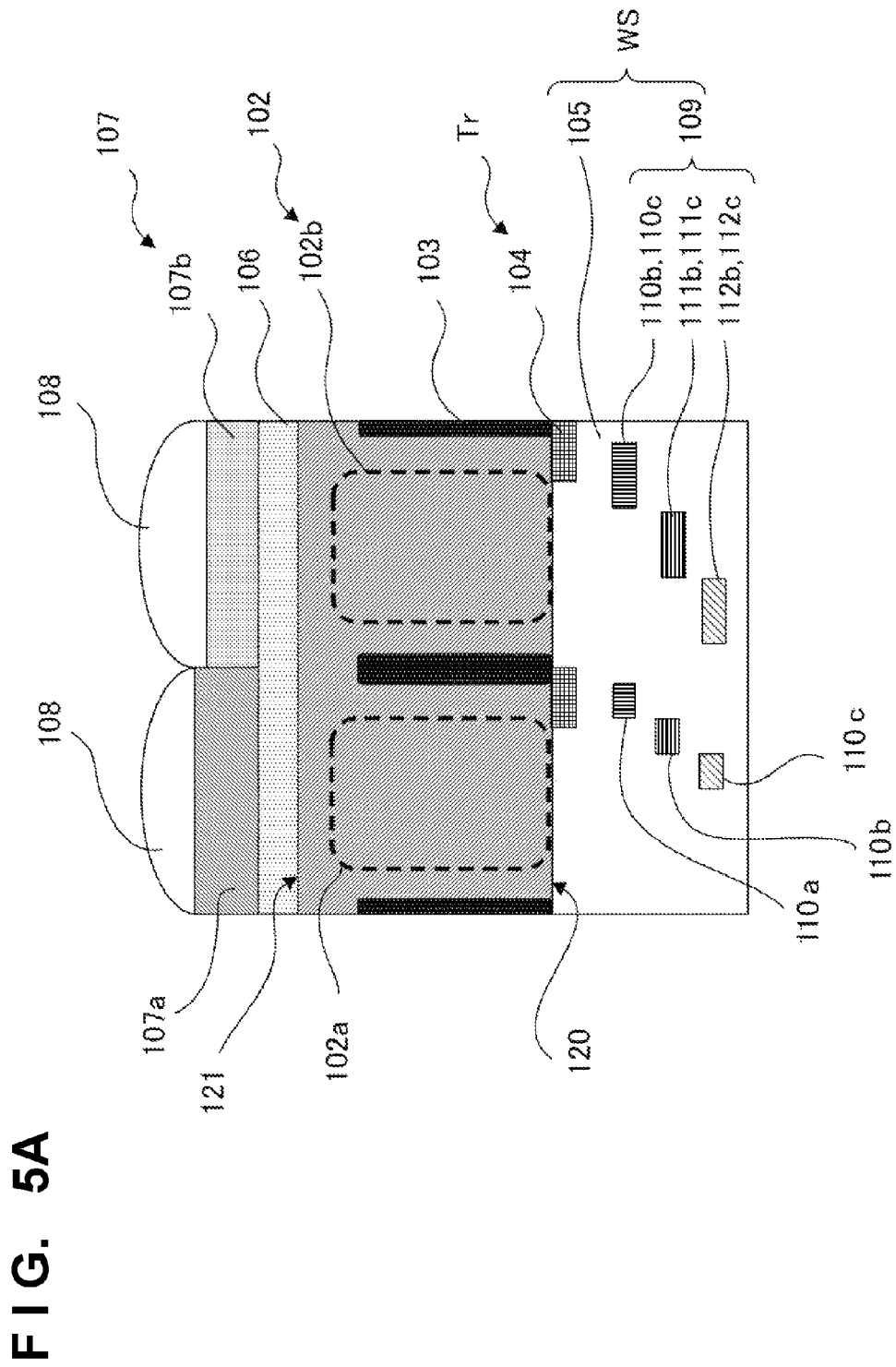
FIGS. 5A and 5B are views illustrating the arrangement of a modification of the first embodiment.
Figure 5B:
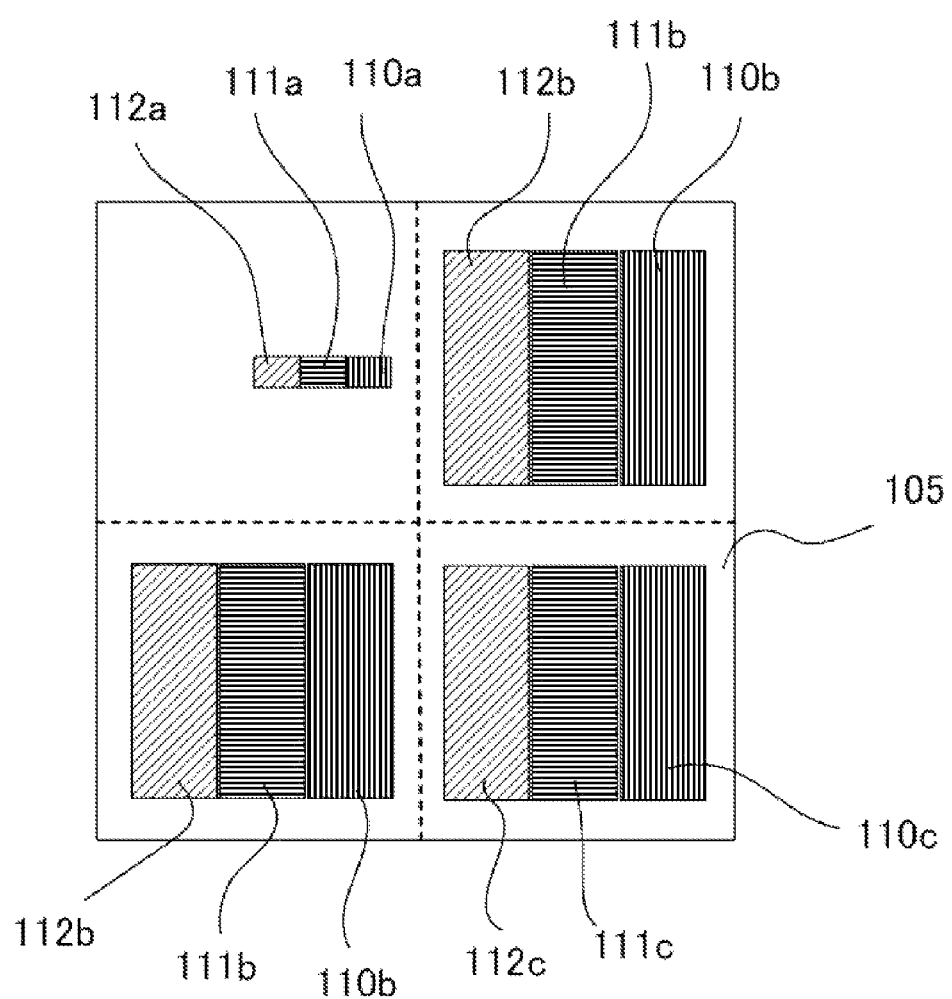

In the first embodiment, the reflection regions 110a, 110b, and 110c are formed by the wiring layer closest to the first face 120 of the semiconductor layer 101 of the plurality of wiring layers 110, 111, and 112. However, the reflection regions 110a, 110b, and 110c may be formed by another wiring layer 111 or 112 or by two or more out of the plurality of wiring layers 110, 111, and 112. The area of the reflection region can be evaluated as that of a portion projected onto the first face 120 when a portion which functions as the reflection region is projected onto the first face 120. FIGS. 5A and 5B exemplify a case in which the reflection regions 110a, 110b, and 110c are formed by the first wiring layer 110, reflection regions 111a, 111b, and 111c are formed by the second wiring layer 111, and reflection regions 112a, 112b, and 112c are formed by the third wiring layer 112. FIG. 5B shows portions, which function as reflection regions, and are projected onto the first face 120. The pixel of the first type includes the first reflection regions 110a, 111a, and 112a, that of the second type includes the second reflection regions 110b, 111b, and 112b, and that of the third type includes the third reflection regions 110c, 111c, and 112c. With this arrangement, since the area of the first wiring layer 110 used to form the reflection regions 110a, 110b, and 110c can be reduced, a parasitic capacitance between the first wiring layer 110 and semiconductor layer 101 can be small, thus reducing noise components.

In the above practical example, the thickness of the semiconductor layer 101 is 3 μm. However, the thickness of the semiconductor layer 101 can be, for example, 2 μm or more. When the thickness of the semiconductor layer 101 is 2 μm or more, 99.0% or more light rays of the wavelength of 450 nm, which are transmitted through the blue color filter 107a, is absorbed after they travel from the second face 121 before they reach the first face 120. Hence, most of these light rays of the wavelength of 450 nm, which are transmitted through the blue color filter 107a, are photoelectrically converted by the photoelectric conversion portion 102 before they reach the first face 120. For this reason, the reflection region 110a formed on the side of the first face 120 of the blue pixel (pixel of the first type) has nearly no influence on the sensitivity if it is smaller than the reflection regions 110b and 110c formed on the side of the first face 120 of the green and red pixels.

The reflection regions 110a, 110b, and 110c can have a concave surface shape, so as to condense light on the corresponding photoelectric conversion portions 102.

By setting focus positions of the microlenses 108 between the first face 120 and the reflection regions 110a, 110b, and 110c, spreads of light rays reflected by the reflection regions 110a, 110b, and 110c can be suppressed. Thus, a returning ratio of light reflected by the reflection regions 110a, 110b, and 110c to the photoelectric conversion portions 102 can be increased, thus improving the sensitivity.

Figure 6:
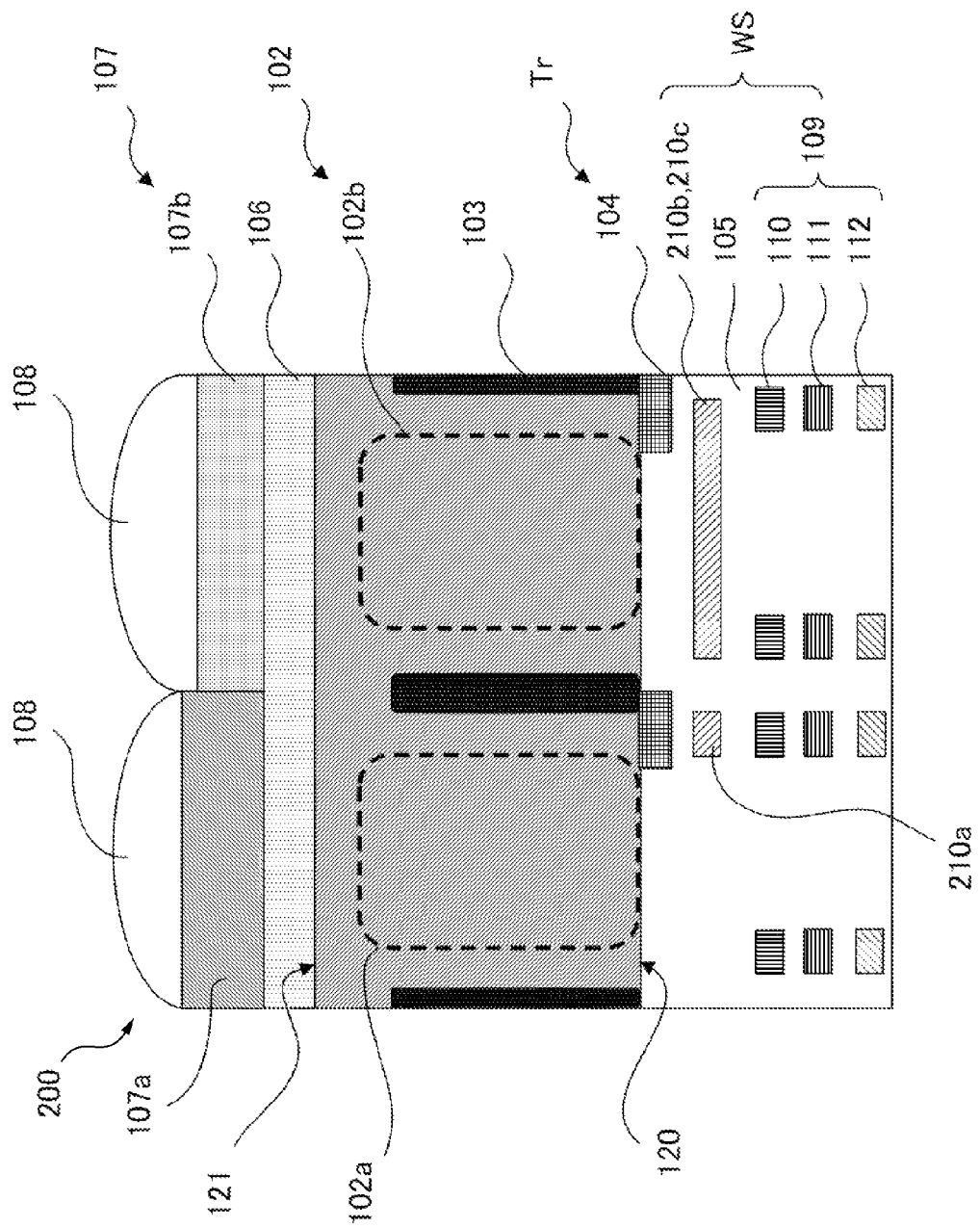
FIG. 6 is a view illustrating the arrangement of a solid-state image sensor according to the second embodiment.
Figure 7:
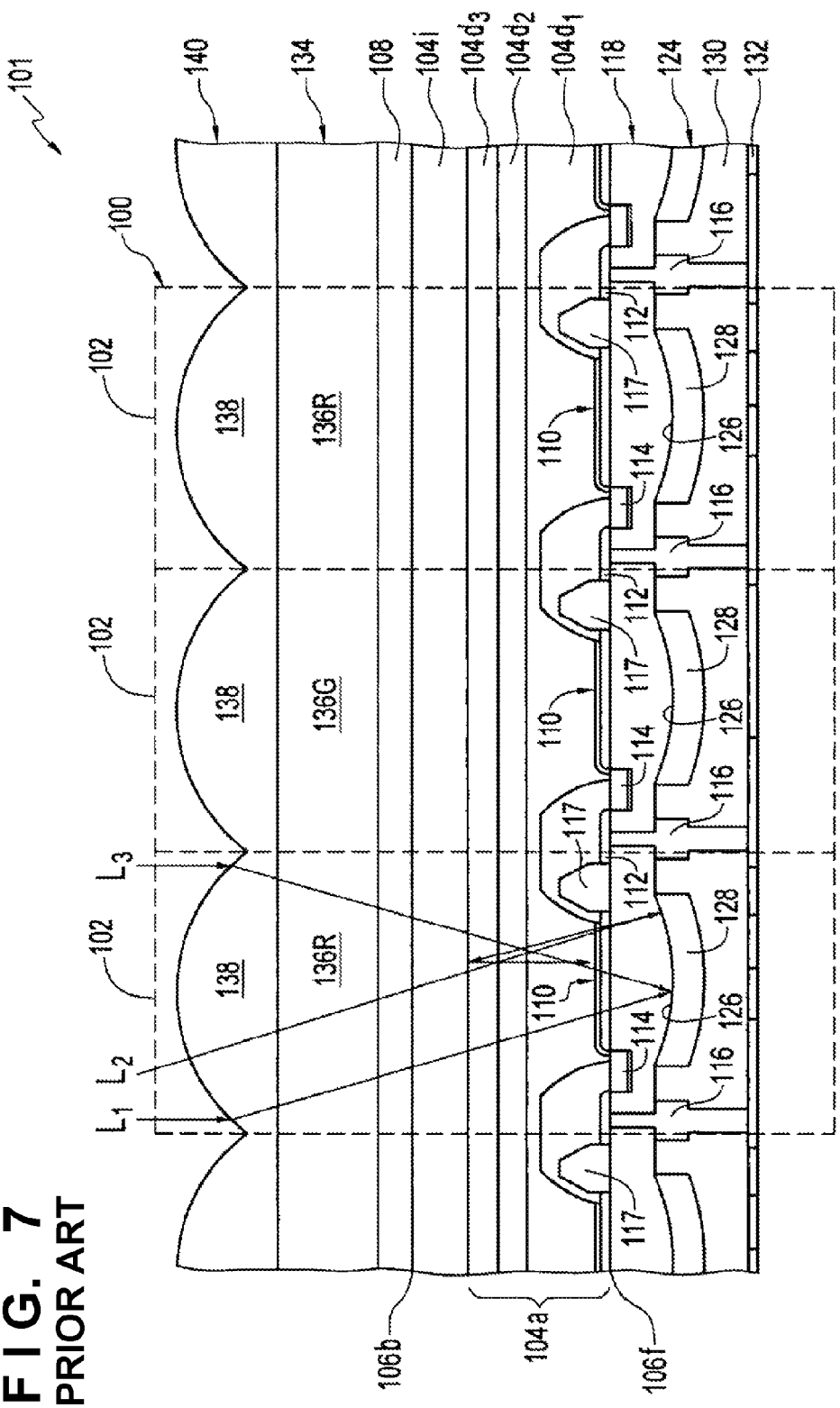
FIG. 7 is a view for explaining a solid-state imaging device described in U.S. Pat. No. 7,755,123.

A solid-state image sensor 200 according to the second embodiment of the present invention will be described below with reference to FIG. 6. Items which are not mentioned in this embodiment can follow the first embodiment. In the solid-state image sensor 200 of the second embodiment, reflection regions 210a, 210b, and 210c are arranged at positions different from the stacked wiring portion 109. Note that the reflection regions 210a, 210b, and 210c reflect light rays, which are transmitted through the color filters 107, are incident on the photoelectric conversion portions 102, and are transmitted through the photoelectric conversion portions 102, toward the photoelectric conversion portions 102 as in the aforementioned reflection regions 110a, 110b, and 110c. The first reflection region 210a is included in a pixel of the first type having the first color filter 107a. The second reflection region 210b is included in a pixel of the second type having the second color filter 107b. The third reflection region 210c is included in a pixel of the third type having the third color filter 107c. When a member having the reflection regions 210a, 210b, and 210c is made of a conductive material such as a metal, that member can have a fixed potential applied thereto or can be maintained in a floating state.

The reflection regions 210a, 210b, and 210c can be formed by a member which contains one of aluminum, copper, gold, tungsten, titanium, and tantalum as a major component. Alternatively, the reflection regions 210a, 210b, and 210c may be formed by a dielectric multilayer film. The area of the first reflection region 210a is smaller than that of the second reflection region 210b. Also, the area of the first reflection region 210a is smaller than that of the third reflection region 210c.

In the second embodiment, since the reflection regions 210a, 210b, and 210c are arranged at positions different from the stacked wiring portion 109, a process for forming the reflection regions 210a, 210b, and 210c has to be added. However, compared to the configuration which uses the stacked wiring portion 109 formed for the purpose of wiring also as reflection regions, degrees of freedom in arrangement of the reflection regions 210a, 210b, and 210c are high, and the reflection regions 210a, 210b, and 210c can be arranged at positions closer to the first face 120. Thus, stray light can be reduced. As a result, the sensitivity can be improved, and mixture of colors can be reduced. Also, compared to the configuration which uses the stacked wiring portion 109 formed for the purpose of wiring also as reflection regions, since the reflection regions 210a, 210b, and 210c have higher degrees of freedom in selection of materials required to form them, materials having higher reflectances than aluminum and copper can be used. Thus, the sensitivity can be improved. In addition, compared to the configuration which uses the stacked wiring portion 109 formed for the purpose of wiring also as reflection regions, the reflection regions 210a, 210b, and 210c have higher degrees of freedom in shape. For example, a concave surface shape for condensing light on the photoelectric conversion portion can be adopted. Thus, the sensitivity can be improved.

In the second embodiment, all of pixels of the first, second, and third types have the reflection regions formed of the member different from the stacked wiring portion 109. However, in the present invention, some of the pixels of the first, second, and third types may have the reflection regions formed by the member different from the stacked wiring portion 109, and the remaining pixels may have the reflection regions formed by the stacked wiring portion 109. For example, the reflection regions of blue and green pixels can be formed by the first wiring layer 110, and those of red pixels can be arranged at positions between the first face 120 and first wiring layer 110. This arrangement is advantageous to set the reflectance of the reflection regions of the red pixels to be higher than those of the reflection regions of the blue and green pixels and to improve the sensitivity of the red pixels. Alternatively, the reflection regions of blue pixels can be formed by the first wiring layer 110, and those of green and red pixels can be arranged at positions between the first face 120 and first wiring layer 110. This arrangement is advantageous to set the reflectance of the reflection regions of the green and red pixels to be higher than that of the reflection regions of the blue pixels and to improve the sensitivity of the green and red pixels.

The formation positions of the reflection regions 210a, 210b, and 210c are not limited to those between the semiconductor layer 101 and stacked wiring portion 109. For example, the reflection regions 210a, 210b, and 210c may be formed between the wiring layers 110, 111, and 112 in the stacked wiring portion 109. The reflection regions 210a, 210b, and 210c may be arranged at positions according the pixels of the first, second, and third types (that is, at positions according to wavelength ranges of light rays to be reflected). Thus, the sensitivities of the pixels of the first, second, and third types can be individually improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-191072, filed Sep. 1, 2011, which is hereby incorporated by reference herein in its entirety.

The invention claimed is:

1. A solid-state image sensor including a semiconductor layer and a wiring structure, wherein the semiconductor layer is a silicon substrate having a thickness not less than 2 μm, the sensor comprising:
    a pixel of a first type including a first color filter, a first member included in one wiring layer of the wiring structure, and a first photoelectric conversion portion arranged in the semiconductor layer, the first photoelectric conversion portion being located between the first color filter and the first member; and
    a pixel of a second type including a second color filter, a second member included in one wiring layer of the wiring structure, the second member having a reflection region which reflects light transmitted through the semiconductor layer, and a second photoelectric conversion portion arranged in the semiconductor layer, the second photoelectric conversion portion being located between the second color filter and the second member,
    wherein the semiconductor layer has a first face and a second face, the first member and the second member are arranged on a side of the first face, the first color filter and the second color filter are arranged on a side of the second face,
    wherein the wiring structure includes an insulation film disposed between the one wiring layer and the semiconductor layer, and an electrode of polysilicon is arranged between the insulation film and the semiconductor layer,
    wherein a wavelength corresponding to a maximum transmittance of the first color filter is in a blue wavelength range and is shorter than a wavelength corresponding to a maximum transmittance of the second color filter,
    wherein an area of the first member projected onto the first face of the semiconductor layer is smaller than an area of the second member projected onto the first face, and
    wherein the electrode and the first member are both arranged on a single axis perpendicular to the first face.

2. The sensor according to claim 1, wherein the pixel of the first type further includes a first transistor configured to read out a signal of the first photoelectric conversion portion,
    wherein the pixel of the second type further includes a second transistor to read out a signal of the second photoelectric conversion portion, and
    wherein the electrode is a gate electrode of the first transistor.

3. The sensor according to claim 1, wherein a gate electrode of the second transistor and the second member are both arranged on a single axis perpendicular to the first face.

4. The sensor according to claim 1, wherein the first member is positioned between the electrode and another wiring layer of the wiring structure in a direction perpendicular to the first face.

5. The sensor according to claim 1, wherein the one wiring layer including the first member and the second member is arranged between the semiconductor layer and a plurality of wiring layers of the wiring structure.

6. The sensor according to claim 1, further comprising:
    a pixel of a third type including a third color filter, third member included in one wiring layer of the wiring structure, and a third photoelectric conversion portion arranged in the semiconductor layer, the third photoelectric conversion portion being located between the third color filter and the third member,
    wherein the wavelength corresponding to the maximum transmittance of the second color filter is shorter than a wavelength corresponding to a maximum transmittance of the third color filter, and
    wherein the area of the second member projected onto the first face is not smaller than an area of the third member projected onto the first face.

7. The sensor according to claim 1, wherein the first member and the second member contain one of aluminum, copper, gold, tungsten, titanium, and tantalum as a major component.

8. The sensor according to claim 1, wherein 99.0% or more of light rays which are transmitted through the first color filter is absorbed by the semiconductor layer before the light rays reach the first face.

9. The sensor according to claim 1, wherein an insulator is arranged between the first photoelectric conversion portion and the second photoelectric conversion portion.

10. The sensor according to claim 1, wherein the pixel of the first type further includes a first microlens arranged on the side of the second face,
    wherein the pixel of the second type further includes a second microlens arranged on the side of the second face, and wherein a focus position of the second microlens being set between the first face and the reflection region of the second member.

11. The sensor according to claim 1, wherein the wavelength corresponding to the maximum transmittance of the second color filter is in a green wavelength range.

12. The sensor according to claim 6, the area of the first member projected onto the first face is smaller than an area of the third member projected onto the first face.

13. The sensor according to claim 1, wherein the reflection region of the second member has a concave surface.

14. The sensor according to claim 1, wherein the first member and the second member applied with a fixed potential.

15. The sensor according to claim 1, wherein an entire area of the first member projected onto the first face is included in an area of the electrode projected onto the first face.

* * * * *